(12) United States Patent
Ivanov et al.

(10) Patent No.: US 7,557,366 B2
(45) Date of Patent: Jul. 7, 2009

(54) RADIATION GENERATING DEVICE, LITHOGRAPHIC APPARATUS, DEVICE MANUFACTURING METHOD AND DEVICE MANUFACTURED THEREBY

(75) Inventors: Vladimir Vitalevitch Ivanov, Moscow (RU); Vadim Yevgenyevich Banine, Helmond (NL); Vladimir Mihailovitch Krivtsun, Troitsk (RU)

(73) Assignee: ASML Netherlands B.V., Veldhoven (NL)

( * ) Notice: Subject to any disclaimer, the term of this patent is extended or adjusted under 35 U.S.C. 154(b) by 614 days.

(21) Appl. No.: 11/417,211

(22) Filed: May 4, 2006

(65) Prior Publication Data

US 2008/0067453 A1 Mar. 20, 2008

(51) Int. Cl.
*H05G 2/00* (2006.01)
(52) U.S. Cl. .................. 250/504 R; 250/492.1; 250/492.2
(58) Field of Classification Search ........... 250/492.1, 250/492.2, 504 R; 378/119
See application file for complete search history.

(56) References Cited

U.S. PATENT DOCUMENTS

2003/0006383 A1* 1/2003 Melnychuk et al. ..... 250/504 R

2006/0011864 A1 1/2006 Koshelev et al.

FOREIGN PATENT DOCUMENTS

| WO | 2005/025280 A2 | 3/2005 |
| WO | 2005025280 A2 * | 3/2005 |

* cited by examiner

*Primary Examiner*—Jack I Berman
*Assistant Examiner*—Hanway Chang
(74) *Attorney, Agent, or Firm*—Pillsbury Winthrop Shaw Pittman LLP (57) ABSTRACT

An apparatus for producing radiation by an electrically operated discharge has a first electrode, a second electrode. and a capacitor bank. The electrodes are configured at a distance from each other which allows plasma ignition. The capacitor bank is electrically connected at a first terminal to the first electrode and at a second terminal to the second electrode, and configured to store a discharge energy. The electrodes and the capacitor bank form an electric circuit. At least the first electrode is formed by an electrically conducting fluid supplied via a first feeding line. The apparatus further has a charger and a first high inductance unit. The charger is connected to at least one of the terminals. The first high inductance unit is provided upstream the first terminal in the first feeding line for electrically decoupling the electric circuit.

42 Claims, 4 Drawing Sheets

RADIATION GENERATING DEVICE, LITHOGRAPHIC APPARATUS, DEVICE MANUFACTURING METHOD AND DEVICE MANUFACTURED THEREBY

BACKGROUND OF THE INVENTION

1. Field of the Invention

The present invention relates to a radiation generating device, a lithographic apparatus, a method for manufacturing a device and a device manufactured thereby.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus the size of features that can be imaged onto the substrate is limited by the wavelength of the radiation beam. To produce integrated circuits with a higher density of devices, and hence higher operating speeds, it is desirable to be able to image smaller features. While most current lithographic projection apparatus employ ultraviolet light generated by mercury lamps or excimer laser, it has been proposed to use shorter wavelength radiation, e.g. of about 13 nm. Such radiation is termed extreme ultraviolet (EUV) or soft x-ray, and possible sources include laser-produced plasma sources and discharge plasma sources. These sources use high voltages and require awareness of operators with respect to safety issues during operation.

SUMMARY OF THE INVENTION

It is desirable to provide an apparatus for producing radiation with an improved performance in view of the prior art.

To that end, in an embodiment, the invention provides an apparatus for producing radiation by an electrically operated discharge. The apparatus includes a first electrode and a second electrode, the first and second electrode being configured at a distance from each other which allows ignition of a plasma in a gaseous medium between the first and second electrode; a capacitor bank electrically connected at a first terminal to the first electrode and at a second terminal to the second electrode, the capacitor bank configured to store a discharge energy needed for the ignition of the plasma, the first electrode, second electrode and capacitor bank forming an electric circuit, wherein at least the first electrode is formed by an electrically conducting fluid supplied via a first feeding line.

The apparatus may further include a charger connected to at least one of the first and second terminals for charging the capacitor bank in a time varying manner; a first high inductance unit provided upstream the first terminal in the first feeding line for electrically decoupling the electric circuit.

Moreover, the invention provides a lithographic apparatus including an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein the illumination system includes such an apparatus for producing radiation by an electrically operated discharge.

Additionally, the invention provides a device manufactured with such a lithographic apparatus.

The invention also relates to an apparatus for producing radiation by an electrically operated discharge. The apparatus includes a first electrode and a second electrode, the first and second electrode being configured at a distance from each other which allows ignition of a plasma in a gaseous medium between the first and second electrode; a capacitor bank electrically connected at a first terminal to the first electrode and at a second terminal to the second electrode, the capacitor bank configured to store a discharge energy needed for the ignition of the plasma, the first electrode, second electrode and capacitor bank forming an electric circuit, wherein the first electrode is formed by an electrically conducting fluid supplied via a first feeding line, and the second electrode is formed by electrically conducting fluid supplied via a second feeding line, the first feeding line including a first nozzle configured to provide the first electrode in the form of a first jet of a certain material and the second feeding line including a second nozzle configured to provide the second electrode in the form of a second jet of a certain material.

The apparatus may further include a charger for charging the capacitor bank in a time varying manner; a first high inductance unit provided upstream the first terminal in the first feeding line, the first high inductance unit including a first coil-shaped portion of the first feeding line; a second high inductance unit provided upstream the second terminal in the second feeding line, the second high inductance unit including a second coil-shaped portion of the second feeding line.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
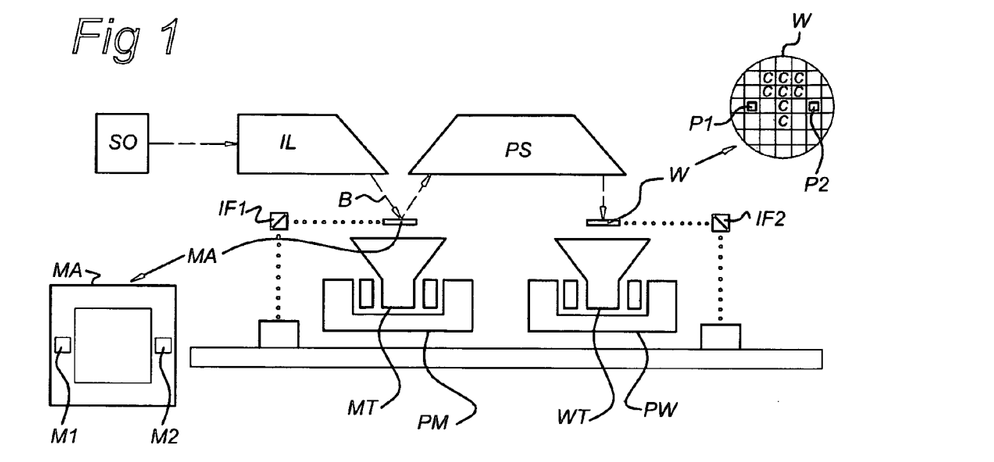
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In this description, an embodiment of the invention will be explained by way of example as applied to a radiation source as described in United States Patent Application Publication 2006/0011864 A1 by this applicant. It should be appreciated, however, that similar or other embodiments may be applied to different radiation sources, for instance an EUV/soft X-ray source as described in International Application Publication WO2005/025280 by Philips.

Figure 2:
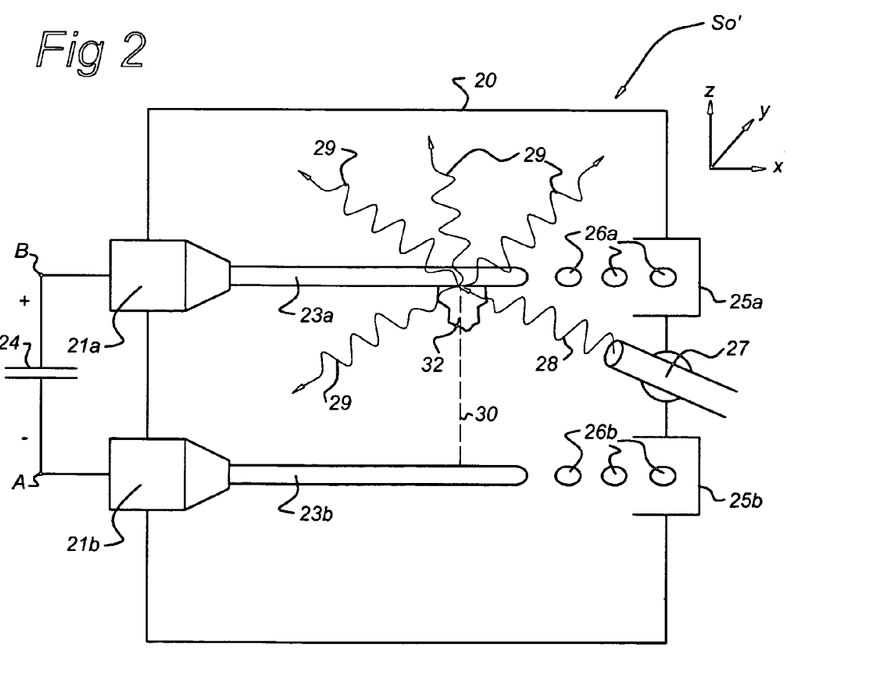
FIG. 2 depicts a radiation source according to the prior art.

FIG. 2 depicts a radiation source SO' as known from United States Patent Application Publication US2006/0011864 A1. The radiation source SO' includes a housing 20 configured to accommodate two nozzles 21a, 21b that are electrically connected to a capacitor bank 24, in this case including a single capacitor, configured to store a discharge energy. The capacitor bank 24 has a positive terminal B and a negative terminal A. The nozzles 21a, 21b provide electrically conductive jets 23a, 23b of a fluid. The fluid is supplied via a feeding line (not shown), e.g. a suitable hose or pipe configured to accommodate a fluid stream. Throughout this description fluid refers to both a material in a liquid state, e.g. a melt, and solid particles immersed in a liquid as carrier. The fluid may include one or more elements selected from a group including tin (Sn), indium (In), gallium (Ga) and lithium (Li). The use of an electrically conductive material like Sn, In, Ga or Li ensures that the jets 23a, 23b are electrically connected with the capacitor bank 24. Consequently, jets 23a, 23b may be considered to be electrodes. In the case depicted in FIG. 2, jet 23a is provided with a positive voltage and therefore acts as an anode. The other jet, i.e. jet 23b, is provided with a negative voltage and acts as a cathode.

The housing 20 further accommodates two reservoirs 25a, 25b. As the jets 23a, 23b proceed in space within the housing 20, they disintegrate into droplets 26a, 26b respectively. The reservoirs 25a, 25b are configured to collect the separate droplets 26a, 26b respectively. The disintegration into droplets 26a, 26b prevents electrical contact between the reservoirs 25a, 25b and capacitor bank 24. It must be appreciated that besides two reservoirs 25a, 25b, it is also possible to use a single reservoir for collection of separate droplets 26a, 26b of both jets 23a, 23b respectively. A suitable length for the jets 23a, 23b to ensure that they will disintegrate into droplets 26a, 26b, respectively, is 3-30 cm for a jet diameter of 0.2-1 mm.

The housing 20 further accommodates an energy source, e.g. a laser source 27, configured to provide an energy beam, e.g. a laser beam 28. The laser beam 28 is aimed at one of the jets 23a, 23b, in this case jet 23a, to locally, i.e. at the location where the laser beam 28 hits the jet 23a, evaporate electrically conductive material in the jet 23a to form a gaseous medium 32. The presence of this gaseous medium 32 allows the ignition of a plasma caused by a discharge 30, generating radiation 29, e.g. EUV-radiation or soft X-ray radiation.

Typical parameters for the laser source 27 are:
energy per pulse: 10-100 mJ for a Sn discharge and 1-10 mJ for a Li discharge;
pulse duration: 1-100 ns;
laser wavelength: 0.2-10 µm; and
laser frequency: 5-100 kHz.

Figure 3:
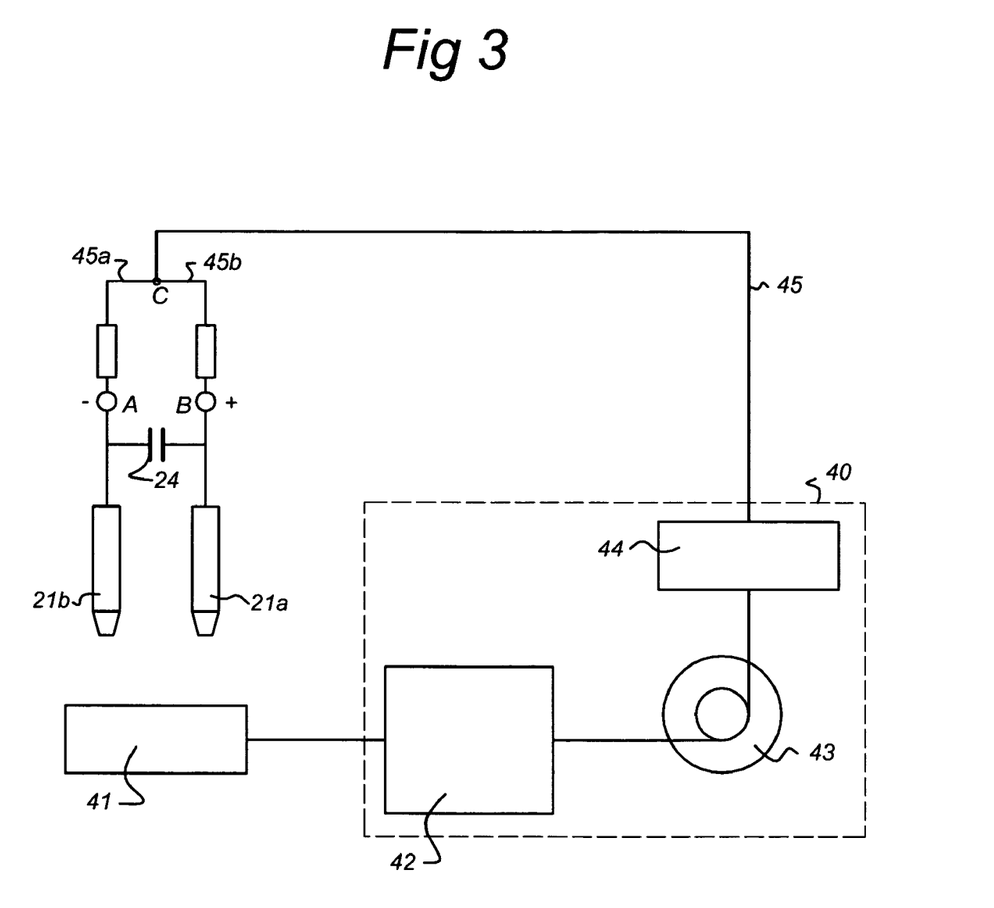
FIG. 3 depicts an assembly including a feedback system that can be used in conjunction with the radiation source of FIG. 2.

FIG. 3 schematically depicts an assembly including a feedback system 40 that can be used in conjunction with the radiation source of FIG. 2. The feedback system 40 is configured to reuse the electrically conducting fluid as collected in droplets 26a, 26b by the reservoirs 25a, 25b respectively. In FIG. 3, a single reservoir 41 is depicted. The feedback system includes a melting chamber 42, a pump 43 and a filter 44. The melting chamber is used to melt the electrically conducting material collected by the reservoir 41 into a fluid so as to make it suitable for transport through suitable pipes and hoses 45, i.e. feeding lines, towards the nozzles 21a, 21b. At a junction C, the feeding line 45 splits into a first feeding line 45a to negative terminal A and a second feeding line 45b to positive terminal B. The pump 43 enables such a transport, while the filter 44 filters contaminants out of the fluid. The melting chamber 42, pump 43 and filter 44 may be joint in a single fluid supply unit or feedback unit, but may also form the feedback system 40 as an assembly of separate units.

The discharge energy stored in the capacitor bank 24 results in a high voltage difference between the feeding lines at opposing sides of the capacitor bank 24. Therefore the electrical impedance between terminals A and B via the electrically conductive fluid in feeding lines 45a and 45b needs to be high. However, in practice, the high voltage still reaches the feedback system. To comply with the high voltage, the feedback system 40 may be doubled, i.e. a separate heating chamber 42, pump 43, and filter 44 for each nozzle 21a, 22b to ensure a production of jets 23a, 23b without any short-circuit in the entire assembly. Additionally, the high voltage may be applied to one of the two jets 23a, 23b, and consequently will only reach one of the two feedback systems. However, then operation of the source SO' becomes more difficult and hazardous.

Figure 4:
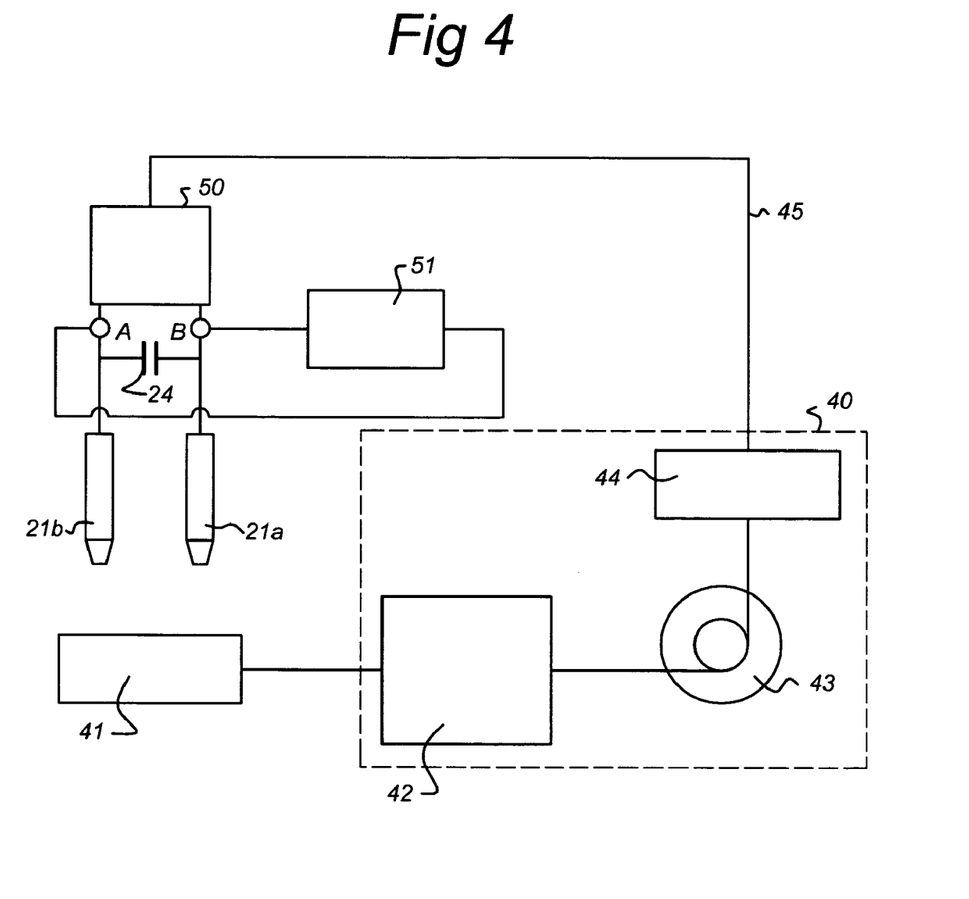
FIG. 4 depicts an assembly as depicted in FIG. 3 provided with an embodiment of the present invention.

FIG. 4 schematically depicts an assembly as depicted in FIG. 3 provided with an embodiment of the present invention. In this embodiment, the assembly further includes a high inductance unit 50 and a pulsed charger 51, e.g. a pulsed synchronous charger. The high inductance unit 50 is located between junctions A, B and junction C. As disclosed in United States Patent Application Publication 2006/0011864 A1, the current generated by the discharge 30 induces a magnetic field. The magnetic field generates a pinch (compression) in which ions and free electrons are produced by collisions. Some electrons will drop to a lower band than the conduction band of atoms in the pinch and consequently produce aforementioned radiation 29. For an efficient operation of the radiation source SO', i.e. to minimize energy losses, the inductance of the circuit formed by the two jets 23a, 23b, capacitor bank 24 and discharge 30, i.e. the "inner circuit", needs to be as small as possible. This is accomplished by minimizing the distances between aforementioned elements and phenomenon. High inductance unit 50 further increases this aspect, as it provides a high inductance between terminal A and junction C, and between terminal B and junction C. Consequently, the feedback system 40 is decoupled from the inner circuit. Additionally, the high inductance unit 50 prevents energy dissipation before the main discharge 30.

In an embodiment, the pulsed charger 51 is configured to charge one side of the capacitor bank 24 negatively and to charge the other side of the capacitor bank 24 positively, in which the negative and positive charge are equal in amplitude. Consequently, the main part of the feedback system 40 and feeding lines 45 is defined at ground potential and remains at this potential due to the presence of the high inductance unit 50.

In another embodiment, the pulsed charger 51 is configured to charge one side of the capacitor bank 24 either positively or negatively, while the other side of the capacitor bank 24 is grounded. In this case, in an embodiment, the high inductance unit does not decouple the jet 23a, which has a ground potential, but only the jet 23b, which is connected to the side charged by the pulsed charger 51. In such an embodiment, a pump 43 is well protected from breakdown due to electrical causes.

Figure 5:
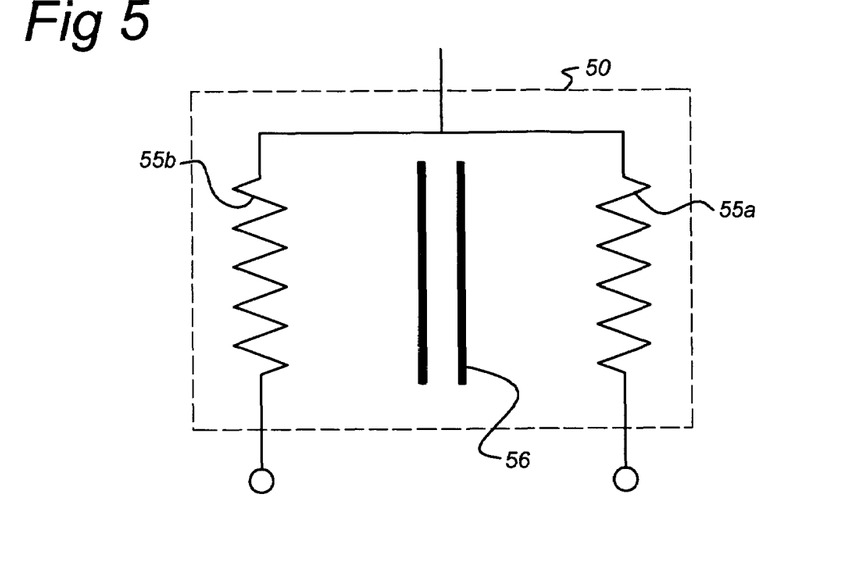
FIG. 5 depicts an embodiment of a high inductance unit as depicted in FIG. 4.

FIG. 5 schematically depicts an embodiment of a high inductance unit 50 as depicted in FIG. 4. The high inductance unit 50 includes a coil 55a, 55b for each feeding line formed by shaping part of the respective feeding lines into respective windings. To provide higher inductance values, and thus longer high inductance unit retention times, and to reduce conductive losses, a saturated core 56, e.g. a ferromagnetic core, may be used in the coils 55a, 55b. The use of such a saturated core 56 enables the realization of an inductance of 0.01-10 mH. As should be appreciated, the saturated core 56 may also operate in a linear (non-saturated) regime. A suitable inductance is dependent on a charging time, which in its turn depends on available power of a charging unit. For example, a total charge of 2 mC, a voltage of 2.4 kV and charging time of 10 μs would result in a minimum inductance of 1 mH. Similarly, a shorter charging time, i.e. 1 μs would lead to a minimum inductance of 0.01 mH. The saturated core 56 may include a ferromagnetic material, e.g. a nanocrystal alloy like METGLAS 2605 CO to enable operation at a frequencies of about 5-100 kHz, i.e. a reasonable frequency for an EUV source. Additionally, such alloys have a high magnetic conductivity, i.e. 50,000-100,000, and a comparatively high Curie temperature of about 400-450° C. In an other embodiment, the saturated core 56 includes another ferromagnetic material, i.e. a ferrite.

It should be appreciated that the schematic representation of the saturated core 56 between the two coils 51a, 51b does not mean that the saturated core 56 is placed between the two coils 51a, 51b. In reality, both coils 51a, 51b are generally winded around the saturated core 56. Alternatively, both coils 51a, 51b may be provided with their own saturated core 56.

Additionally, it should be appreciated, that in an embodiment as described with reference to FIG. 4, in which only one of the two jets 23a, 23b is decoupled, only one of the coils 51a, 51b is present. That is, if for instance jet 23a is charged and jet 23b is kept at a ground potential, only jet 23a will be inductively decoupled by coil 51a.

Instead of decoupling the inner circuit from the feedback system by arranging reservoirs, for example reservoirs 25a, 25b in FIG. 2, at a position such that they collect electrically conducting material already disintegrated in droplets, for example droplets 26a, 26b, a different arrangement for decoupling may be used. In this arrangement, depicted in FIG. 6, an additional high inductance unit 60 is positioned between reservoirs 62a, 62b and feedback lines 63a, 63b. The feedback lines 63a, 63b transport material collected by reservoirs 62a, 62b respectively towards the feedback system 40. It should be appreciated that the feedback lines 63a, 63b may be connected at a junction located between the additional high inductance unit 60 and the feedback system 40 so as to form a single feedback line 63, as is shown in FIG. 6, but may also remain separate.

As the reservoirs 62a, 62b are no longer necessarily at a position at which electrically conductive material of separate electrodes, like jets 23a, 23b in FIG. 2, are disintegrated into droplets, collecting the material in a single reservoir is not possible in this embodiment. In such a case the inner circuit would be short-circuited.

Figure 6:
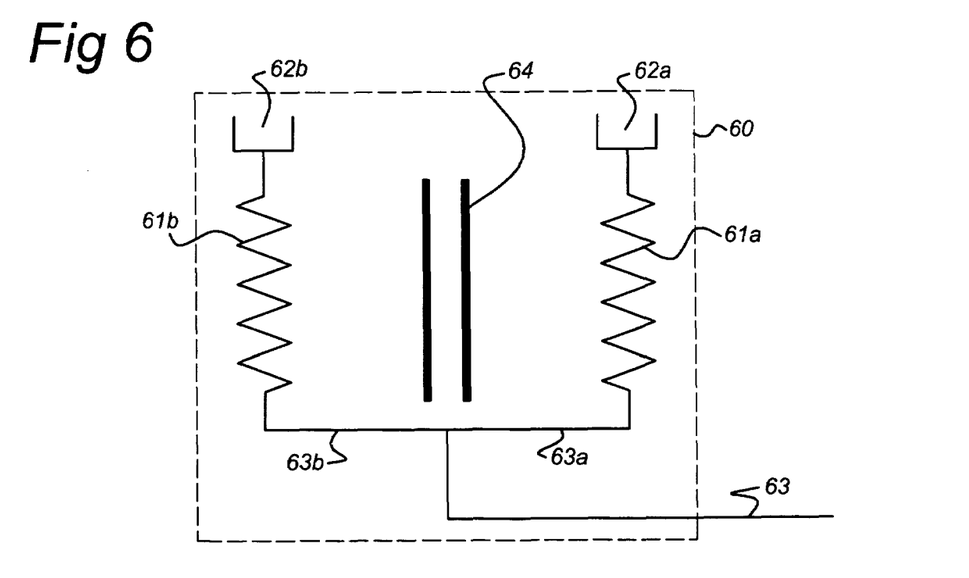
FIG. 6 depicts an embodiment of a high inductance unit at another location in the assembly as depicted in FIG. 4.

In the embodiment shown in FIG. 6, the additional high inductance unit 60 includes two coils 61a, 61b. Each coil corresponds with a feedback line transporting material collected in reservoirs 62a, 62b respectively towards the feedback system 40. The coils 61a, 61b for each feedback line are formed by shaping part of the respective feedback lines into respective windings. To provide higher inductance values, and thus longer high inductance unit retention times, and to reduce conductive losses, a saturated core 64, e.g. a ferromagnetic core, may be used in the coils 61a, 61b. The use of such a saturated core 64 enables the realization of an inductance of 0.01-10 mH. As should be appreciated, the saturated core 64 may also operate in a linear (non-saturated) regime. A suitable inductance is dependent on a charging time, which in its turn depends on available power of a charging unit. For example, a total charge of 2 mC, a voltage of 2.4 kV and charging time of 10 μs would result in a minimum inductance of 1 mH. Similarly, a shorter charging time, i.e. 1 μs would lead to a minimum inductance of 0.01 mH. The saturated core 64 may include a nanocrystal alloy like METGLAS 2605 CO to enable operation at a frequencies of 5-100 kHz, i.e. a reasonable frequency for an EUV source. Additionally, such alloys have a high magnetic conductivity, i.e. 50,000-100, 000, and a comparatively high Curie temperature of about 400-450° C. In an other embodiment, the saturated core 64 includes a ferrite.

Again, it should be appreciated, that the schematic representation of the saturated core 64 between the two coils 61a, 61b does not mean that the saturated core 64 is placed between the two coils 61a, 61b. In reality, both coils 51a, 51b are generally winded around the saturated core 56. Alternatively, both coils 61a, 61b may be provided with their own saturated core 64.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. An apparatus for producing radiation by an electrically operated discharge, comprising:
    a first electrode and a second electrode, the first and second electrode being configured at a distance from each other which allows ignition of a plasma in a gaseous medium between the first and second electrode;
    a capacitor bank electrically connected at a first terminal to the first electrode and at a second terminal to the second electrode, the capacitor bank configured to store a discharge energy needed for the ignition of the plasma, the first electrode, second electrode and capacitor bank forming an electric circuit, wherein at least the first electrode is formed by an electrically conducting fluid supplied via a first feeding line, the apparatus further comprising
    a charger connected to the first terminal and/or the second terminal configured to charge the capacitor bank in a time varying manner; and
    a first high inductance unit provided upstream of the first terminal in the first feeding line for electrically decoupling the electric circuit.

2. An apparatus according to claim 1, wherein the radiation is EUV radiation.

3. An apparatus according to claim 1, wherein the charger is a pulsed charger.

4. An apparatus according to claim 1, further comprising:
    a laser beam configured to form the gaseous medium by providing a laser beam configured to partially evaporate the electrically conducting fluid.

5. An apparatus according to claim 1, wherein the first high inductance unit comprises a first coil-shaped portion of the first feeding line.

6. An apparatus according to claim 5, wherein the first coil-shaped portion is provided with a first saturated core.

7. An apparatus according to claim 6, wherein the first saturated core includes a ferromagnetic material of a group comprising a nanocrystal alloy.

8. An apparatus according to claim 7, wherein the nanocrystal alloy is METGLAS or a ferrite.

9. An apparatus according to claim 6, wherein the first high inductance unit is configured to provide an inductance of 0.01-10 mH.

10. An apparatus according to claim 1, wherein the first feeding line comprises a first nozzle configured to provide the first electrode in the form of a jet of a material.

11. An apparatus according to claim 10, wherein the material includes a group of elements comprising tin, indium, gallium and/or lithium.

12. An apparatus according to claim 1, wherein the first electrode is formed by an electrically conducting fluid supplied via a first feeding line and the second electrode is formed by an electrically conducting fluid supplied via a second feeding line, the first feeding line comprising a first nozzle downstream the first terminal configured to provide the first electrode in the form of a first jet of a material, and the second feeding line comprising a second nozzle downstream the second terminal configured to provide the second electrode in the form of a second jet of the material, wherein the apparatus further comprises a second high inductance unit upstream the second terminal in the second feeding line for electrically decoupling the electric circuit.

13. An apparatus according to claim 12, wherein the first high inductance unit comprises a first coil-shaped portion of the first feeding line and the second high inductance unit comprises a second coil-shaped portion of the second feeding line.

14. An apparatus according to claim 13, wherein the first coil-shaped portion is provided with a first saturated core and the second coil-shaped portion is provided with a second saturated core.

15. An apparatus according to claim 14, wherein at least one of the first saturated core and the second saturated core includes a ferromagnetic material of a group comprising a nanocrystal alloy.

16. An apparatus according to claim 15, wherein the nanocyrstal alloy is METGLAS or a ferrite.

17. An apparatus according to claim 15, wherein at least one of the first high inductance unit and the second high inductance unit is configured to provide an inductance of 0.01-10 mH.

18. An apparatus according to claim 12, wherein the material includes a group of elements comprising tin, indium, gallium and/or lithium.

19. An apparatus according to claim 10, further comprising:
a reservoir configured to collect the jet of the material at a position at which the jet has disintegrated in droplets.

20. An apparatus according to claim 10, wherein the apparatus further comprises a reservoir configured to collect the jet of the material and a feedback system configured to feedback the material collected in the reservoir towards the first feeding line, the feedback system comprising
a melt chamber connected to the reservoir configured to melt the material collected to form a melt of the certain material;
a filter connected to the first feeding line configured to filter contamination from the melt of the material; and
a pump configured to pump the melt from the melt chamber towards the filter.

21. An apparatus according to claim 20, wherein the reservoir comprises a first collecting unit configured to collect the material of the jet corresponding to the first electrode, the apparatus further being provided with a third high inductance unit in a first feedback line between the reservoir and the feedback system.

22. An apparatus according to claim 21, wherein the third high inductance unit comprises a third coil-shaped portion in the first feedback line.

23. An apparatus according to claim 22, wherein the third coil-shaped portion is provided with a third saturated core.

24. An apparatus according to claim 23, wherein the third saturated core includes a ferromagnetic material of a group comprising a nanocrystal alloy.

25. An apparatus according to claim 24, wherein the nanocrystal allow is METGLAS or a ferrite.

26. An apparatus according to claim 23, wherein the third high inductance unit is configured to provide an inductance of 0.01-10 mH.

27. An apparatus according to claim 12, further comprising:
a first reservoir configured to collect the first jet of the certain material;
a second reservoir configured to collect the second jet of the certain material; and
a feedback system connected to the first reservoir via a first feedback line and to the second reservoir via a second feedback line, the feedback system being configured to feedback the certain material collected in the first and second reservoir towards the first feeding line and/or the second feeding line, the feedback system comprising
melt chamber connected to the first and second reservoir configured to melt the material as respectively collected to form a melt of the certain material;
a filter connected to the first feeding line and/or the second feeding line configured to filter contamination from the melt of the material; and
a pump configured to pump the melt from the melt chamber towards the filter, wherein the apparatus is further provided with a third high inductance unit downstream the first reservoir in the first feedback line and a fourth high inductance unit downstream the second reservoir in the second feedback line.

28. An apparatus according to claim 27, wherein the third high inductance unit comprises a third coil-shaped portion in the first feedback line, and the fourth high inductance unit comprises a fourth coil-shaped portion in the second feedback line.

29. An apparatus according to claim 28, wherein the third coil-shaped portion is provided with a third saturated core, and the fourth coil-shaped portion is provided with a fourth saturated core.

30. An apparatus according to claim 29, wherein at least one of the third saturated core and the fourth saturated core includes a ferromagnetic material of a group comprising a nanocrystal alloy.

31. An apparatus according to claim 30, wherein the nanocrystal alloy is METGLAS or a ferrite.

32. An apparatus according to claim 29, wherein at least one of the third high inductance unit and the fourth high inductance unit is configured to provide an inductance of 0.01-10 mH.

33. A lithographic apparatus, comprising:
an illumination system configured to condition a radiation beam;
a support configured to support a patterning device, the patterning device being configured to impart the radiation beam with a pattern in its cross-section to form a patterned radiation beam;
a substrate table configured to hold a substrate; and
a projection system configured to project the patterned radiation beam onto a target portion of the substrate, wherein the illumination system comprises an apparatus for producing radiation by an electrically operated discharge, the apparatus comprising
a first electrode and a second electrode, the first and second electrode being configured at a distance from each other which allows ignition of a plasma in a gaseous medium between the first and second electrode;
a capacitor bank electrically connected at a first terminal to the first electrode and at a second terminal to the second electrode, the capacitor bank configured to store a discharge energy needed for the ignition of the plasma, the first electrode, second electrode and capacitor bank forming an electric circuit, wherein at least the first electrode is formed by an electrically conducting fluid supplied via a first feeding line, the apparatus further comprising
a charger connected to the first terminal and/or the second terminal configured to charge the capacitor bank in a time varying manner; and
a first high inductance unit provided upstream of the first terminal in the first feeding line configured to electrically decouple the electric circuit.

34. An apparatus for producing radiation by an electrically operated discharge comprising:
a first electrode and a second electrode, the first and second electrode being configured at a distance from each other which allows ignition of a plasma in a gaseous medium between the first and second electrode;
a capacitor bank electrically connected at a first terminal to the first electrode and at a second terminal to the second electrode, the capacitor bank configured to store a discharge energy needed for the ignition of the plasma, the first electrode, second electrode and capacitor bank forming an electric circuit, wherein the first electrode is formed by an electrically conducting fluid supplied via a first feeding line, and the second electrode is formed by electrically conducting fluid supplied via a second feeding line, the first feeding line comprising a first nozzle configured to provide the first electrode in the form of a first jet of a material and the second feeding line comprising a second nozzle configured to provide the second electrode in the form of a second jet of a material, the apparatus further comprising:

a charger configured to charge the capacitor bank in a time varying manner;

a first high inductance unit provided upstream the first terminal in the first feeding line, the first high inductance unit comprising a first coil-shaped portion of the first feeding line;

a second high inductance unit provided upstream the second terminal in the second feeding line, the second high inductance unit comprising a second coil-shaped portion of the second feeding line.

35. An apparatus according to claim 34, wherein the radiation is EUV radiation.

36. An apparatus according to claim 34, wherein the charger is a pulsed charger.

37. An apparatus according to claim 34, wherein the first coil-shaped portion and/or the second coil-shaped portion is provided with a saturated core.

38. An apparatus according to claim 37, wherein the saturated core includes a ferromagnetic material from a group comprising a nanocrystal alloy.

39. An apparatus according to claim 38, wherein th nanocrystal alloy is METGLAS or a ferrite.

40. An apparatus according to claim 37, wherein the first high inductance unit and/or second high inductance unit is configured to provide an inductance of 0.01-10 mH.

41. A device manufacturing method, comprising:

providing radiation from a radiation source configured to produce radiation by an electrically operated discharge, the radiation source comprising a first electrode and a second electrode, the first and second electrode being configured at a distance from each other which allows ignition of a plasma in a gaseous medium between the first and second electrode;

a capacitor bank electrically connected at a first terminal to the first electrode and at a second terminal to the second electrode, the capacitor bank configured to store a discharge energy needed for the ignition of the plasma, the first electrode, second electrode and capacitor bank forming an electric circuit, wherein at least the first electrode is formed by an electrically conducting fluid supplied via a first feeding line, the apparatus further comprising a charger connected to the first terminal and/or the second terminal configured to charge the capacitor bank in a time varying manner; and a first high inductance unit provided upstream of the first terminal in the first feeding line for electrically decoupling the electric circuit;

conditioning a beam of radiation from the radiation;

patterning the beam of radiation; and projecting the patterned beam of radiation onto a target portion of a substrate.

42. A device manufactured by the method of claim 41.

* * * * *